United States Patent
Iwakiri et al.

(10) Patent No.: US 10,840,415 B2
(45) Date of Patent: Nov. 17, 2020

(54) METHOD FOR MANUFACTURING LIGHT-TRANSMISSIVE MEMBER AND METHOD FOR MANUFACTURING LIGHT-EMITTING DEVICE

(71) Applicant: NICHIA CORPORATION, Anan-shi, Tokushima (JP)

(72) Inventors: Yoko Iwakiri, Tokushima (JP); Takao Nakauchi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/922,143

(22) Filed: Mar. 15, 2018

(65) Prior Publication Data

US 2018/0269363 A1  Sep. 20, 2018

(30) Foreign Application Priority Data

Mar. 17, 2017  (JP) .................................. 2017-053575

(51) Int. Cl.
*H01L 33/50* (2010.01)
*H01L 33/60* (2010.01)
*H01L 21/304* (2006.01)

(52) U.S. Cl.
CPC ............ *H01L 33/505* (2013.01); *H01L 33/50* (2013.01); *H01L 33/502* (2013.01);
(Continued)

(58) Field of Classification Search
CPC ... H01L 33/505; H01L 33/507; H01L 33/502; H01L 33/60; H01L 2933/0041
See application file for complete search history.

(56) References Cited

U.S. PATENT DOCUMENTS

2006/0198576 A1  9/2006  Furusawa et al.
2008/0128730 A1*  6/2008  Fellows ................. H01L 33/22
257/98

(Continued)

FOREIGN PATENT DOCUMENTS

JP  2003-101074 A  4/2003
JP  2004-206057 A  7/2004
(Continued)

OTHER PUBLICATIONS

Machine Translation of WO2015/060289.*
Machine Translation of JP2011-109003.*

*Primary Examiner* — Julia Slutsker
(74) *Attorney, Agent, or Firm* — Foley & Lardner LLP (57) ABSTRACT

A method for manufacturing a light-transmissive member includes: providing a supporting member, and a light-transmissive sheet disposed on the supporting member, the light-transmissive sheet including: a first layer containing substantially no phosphor, and a second layer containing a phosphor; and forming a plurality of light-transmissive members from the light-transmissive sheet by dividing the light-transmissive sheet with a blade over the supporting member, such that each light-transmissive member includes: a first portion formed by separation of the first layer by a first crevice, the first portion containing substantially no phosphor, and a second portion formed by separation of the second layer by a second crevice, the second portion containing a phosphor, wherein one of the first portion and the second portion is layered on the other of the first portion and the second portion.

20 Claims, 9 Drawing Sheets (52) U.S. Cl.
CPC ............ *H01L 33/507* (2013.01); *H01L 33/60* (2013.01); *H01L 21/304* (2013.01); *H01L 2933/0041* (2013.01)

(56) References Cited

U.S. PATENT DOCUMENTS

| | | | |
|---|---|---|---|
| 2011/0002127 A1 | 1/2011 | Ter Laak et al. | |
| 2011/0211334 A1* | 9/2011 | Kim | H01L 33/54 362/84 |
| 2014/0291705 A1* | 10/2014 | Kwak | H01L 33/50 257/88 |
| 2014/0328046 A1* | 11/2014 | Aanegola | F21V 13/08 362/84 |
| 2015/0340547 A1 | 11/2015 | Tamaki | |
| 2017/0012183 A1 | 1/2017 | Schricker et al. | |
| 2017/0301832 A1 | 10/2017 | Basin et al. | |
| 2017/0342320 A1* | 11/2017 | Tsumori | C09K 11/02 |
| 2018/0277725 A1* | 9/2018 | Xiong | H01L 33/502 |

FOREIGN PATENT DOCUMENTS

| | | |
|---|---|---|
| JP | 2006-292821 A | 10/2006 |
| JP | 2009-262251 A | 11/2009 |
| JP | 2010-219324 A | 9/2010 |
| JP | 2011-511325 A | 4/2011 |
| JP | 2011-109003 A | 6/2011 |
| JP | 2012-138561 A | 7/2012 |
| JP | 2013-001792 A | 1/2013 |
| JP | 2013-077679 A | 4/2013 |
| JP | 2013-247067 A | 12/2013 |
| JP | 2014-022704 A | 2/2014 |
| JP | 2014-116587 A | 6/2014 |
| JP | 2014-133289 A | 7/2014 |
| JP | 2015-032770 A | 2/2015 |
| JP | 2015-052648 A | 3/2015 |
| JP | 2016-001735 A | 1/2016 |
| JP | 2017-501589 A | 1/2017 |
| JP | 2017-506833 A | 3/2017 |
| WO | WO-2009/098654 A1 | 8/2009 |
| WO | WO-2015/060289 A1 | 4/2015 |
| WO | WO-2015/104623 A1 | 7/2015 |
| WO | WO-2015/128750 A1 | 9/2015 |

* cited by examiner

METHOD FOR MANUFACTURING LIGHT-TRANSMISSIVE MEMBER AND METHOD FOR MANUFACTURING LIGHT-EMITTING DEVICE

CROSS-REFERENCE TO RELATED APPLICATION

The present application claims priority to Japanese Patent Application No. 2017-053575, filed on Mar. 17, 2017, the contents of which are hereby incorporated by reference in their entirety.

BACKGROUND

The present disclosure relates to a method for manufacturing a light-transmissive member and a method for manufacturing a light-emitting device.

It is known that light-transmissive members used in light-emitting devices are manufactured by, for example, dividing an optical sheet provided on a carrier (for example, see WO2009/098654).

An embodiment according to the present disclosure has an object to provide a simple method for manufacturing a light-transmissive member and a simple method for manufacturing a light-emitting device.

SUMMARY

According to one embodiment of the present disclosure, a method for manufacturing a light-transmissive member includes: providing a supporting member provided with a light-transmissive sheet including a first layer containing substantially no phosphor and a second layer containing a phosphor; and forming, from the light-transmissive sheet by dividing with a blade over the supporting member, a plurality of light-transmissive members each including a phosphor-free portion formed by separation of the first layer by a crevice and a phosphor-containing portion formed by separation of the second layer by a crevice, the phosphor-free portion and the phosphor-containing portion being layered on each other.

According to another embodiment of the present disclosure, a method for manufacturing a light-transmissive member includes: providing a supporting member provided with a light-transmissive sheet including a first layer having a small surface roughness and a second layer having a surface roughness larger than the surface roughness of the first layer and containing a phosphor; and forming, from the light-transmissive sheet by dividing with a blade over the supporting member, a plurality of light-transmissive members each including a phosphor-free portion formed by separation of the first layer by a crevice and a phosphor-containing portion formed by separation of the second layer by a crevice, the phosphor-free portion and the phosphor-containing portion being layered on each other.

According to another embodiment of the present disclosure, a method for manufacturing a light-emitting device includes: mounting the light-transmissive member manufactured by the method for manufacturing a light-transmissive member on a light-emitting element.

According to certain embodiments of the present disclosure, a light-transmissive member and a light-emitting device can be manufactured in a simple way.

DETAILED DESCRIPTION

Methods for manufacturing a light-transmissive member and methods for manufacturing a light-emitting device according to certain embodiments are described below. The drawings referred to in the descriptions below schematically illustrate the embodiments. The scales, the distances, the positional relations, and the like of members may be exaggerated, and illustration of part of the members may be omitted, for clarity. In the descriptions below, the same name or reference numeral generally represents the same member or a member made of the same material, and its repeated detailed description will be omitted as appropriate.

«Method for Manufacturing Light-Transmissive Member»

First, a method for manufacturing a light-transmissive member according an embodiment will be described, with reference to FIG. 1A to FIG. 3B. The method for manufacturing a light-transmissive member includes a first step of providing a supporting member 1 provided with a light-transmissive sheet 8 and a second step of forming a plurality of light-transmissive members 50 from the light-transmissive sheet 8 by dividing with a blade 84 over the supporting member 1.

(First Step)

The supporting member 1 used in the first step is large enough to accept the light-transmissive sheet 8. The supporting member 1 preferably includes an adhesive layer such as a dicing tape to hold the light-transmissive sheet 8. The adhesive layer is preferably made of a UV-curable adhesive. In this case, ultraviolet rays are applied after the light-transmissive sheet 8 is disposed on the adhesive.

The light-transmissive sheet 8 used in the first step is a sheet member that includes a first layer 8A containing substantially no phosphor and a second layer 8B containing a phosphor. The light-transmissive sheet 8 is, for example, a sheet member that can transmit light emitted from a light-emitting element when disposed on the light-emitting element. The light-transmissive sheet 8 includes at least a matrix as described below. Mixing a phosphor as described below in the matrix enables the light-transmissive sheet 8 to function as a wavelength conversion member.

The matrix of the light-transmissive sheet 8 is only required to be light-transmissive to, for example, light emitted from the light-emitting element. The term "light-transmissive" means that the light transmittance at the emission peak wavelength of the light-emitting element is preferably 60% or more, more preferably 70% or more, even more preferably 80% or more. A silicone resin, an epoxy resin, a phenolic resin, a polycarbonate resin, an acrylic resin, or a modified resin of these resins can be used as the matrix of the light-transmissive sheet 8. Glass may also be employed. Among these resins, silicone resins and modified silicone resins have good heat and light resistance and are thus preferable. Specific examples of the silicone resins include dimethyl silicone resins, phenyl-methyl silicone resins, and diphenyl silicone resins. The light-transmissive member may be constituted of a layer of one of these matrix materials or may be constituted by layering two or more of these matrix materials.

Silicone resins and modified silicone resins are comparatively soft materials. Hence, deformation or twisting may be caused by moving or transferring the light-transmissive member that has been formed into, for example, a long piece by cutting by dividing. The manufacturing method in the present embodiment, however, includes a reduced number of times of move or transfer, so that deformation of the light-transmissive member is reduced.

Specific examples of the phosphor below can be used singly, or two or more of the phosphors may be used in combination.

Examples of green-emitting phosphors include yttrium-aluminum-garnet phosphors (for example, $Y_3(Al,Ga)_5O_{12}$:Ce), lutetium-aluminum-garnet phosphors (for example, $Lu_3(Al,Ga)_5O_{12}$:Ce), terbium-aluminum-garnet phosphors (for example, $Tb_3(Al,Ga)_5O_{12}$:Ce) phosphors, silicate phosphors (for example, $(Ba,Sr)_2SiO_4$:Eu), chlorosilicate phosphors (for example, $Ca_8Mg(SiO_4)_4Cl_2$:Eu), β-SiAlON phosphors (for example, $Si_{6-z}Al_zO_zN_{8-z}$:Eu ($0<z<4.2$)), and SGS phosphors (for example, $SrGa_2S_4$:Eu).

Examples of yellow-emitting phosphors include α-SiAlON phosphors (for example, $M_z(Si,Al)_{12}(O,N)_{16}$ (where $0<z\leq2$, and M is Li, Mg, Ca, Y, or a lanthanoid element except for La and Ce). Some of the above green-emitting phosphors emit yellow light. Also, for example, yellow light can be obtained by substituting part of Y in an yttrium-aluminum-garnet phosphor with Gd to shift its emission peak wavelength to a longer wavelength. These phosphors also include phosphors that can emit orange light.

Examples of red-emitting phosphors include nitrogen-containing calcium aluminosilicate (CASN or SCASN) phosphors (for example, $(Sr,Ca)AlSiN_3$:Eu). The examples also include manganese-activated fluoride phosphors (phosphors represented by the general formula (I) $A_2[M_{1-a}Mn_aF_6]$ (in the general formula (I), A is at least one selected from the group consisting of K, Li, Na, Rb, Cs, and $NH_4$, M is at least one element selected from the group consisting of the group 4 elements and the group 14 elements, and a satisfies $0<a<0.2$)). Typical examples of the manganese-activated fluoride phosphors include manganese-activated potassium fluorosilicate phosphors (for example, $K_2SiF_6$:Mn).

(Second Step)

In the second step, the light-transmissive sheet 8 is cut into pieces, that is, separated, over the supporting member 1 by dividing with a cutting device described later to produce the light-transmissive members 50. The light-transmissive sheet 8 is cut with a rotary blade. Accordingly, each of the light-transmissive members 50 obtained after cutting is disposed separated from an adjacent light-transmissive member 50. In other words, the light-transmissive members 50 adjacent to each other are disposed with a crevice therebetween.

Figure 1A:
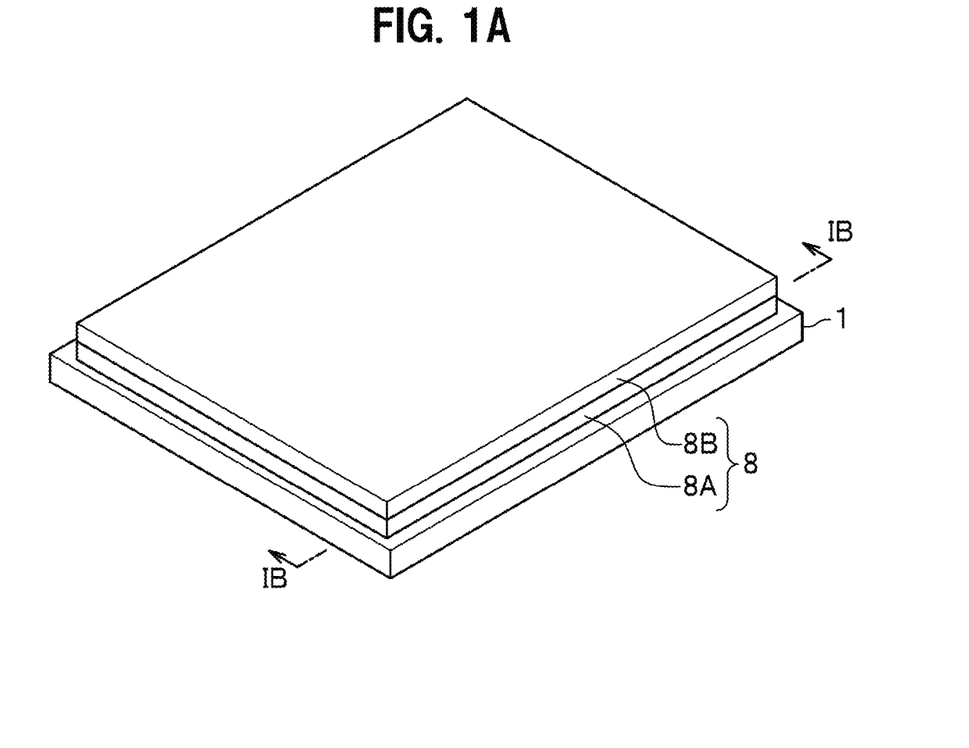
FIG. 1A is a schematic perspective view of a light-transmissive sheet according to the present embodiment.
Figure 1B:
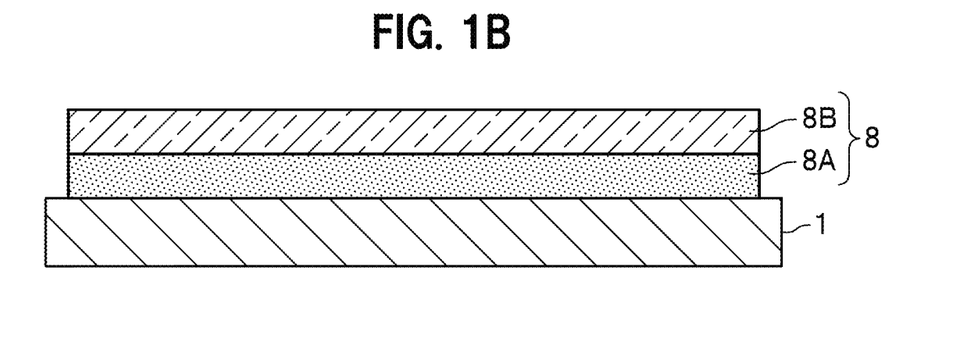
FIG. 1B is a schematic cross-sectional view of the light-transmissive sheet according to the present embodiment taken along the line IB-IB in FIG. 1A.

As shown in FIG. 1A, the light-transmissive sheet 8 includes, for example, the first layer 8A and the second layer 8B in that order layered from the supporting member 1.

The first layer 8A contains substantially no phosphor and is made of the matrix of the light-transmissive sheet 8.

The second layer 8B includes the matrix of the light-transmissive sheet 8 and a phosphor mixed in the matrix.

In the present specification, the second layer 8B is supposed to contain, for example, a manganese-activated fluoride phosphor that emits red light. The second layer 8B may include a plurality of layers each containing different phosphors.

The first layer 8A has a small surface roughness, and the second layer 8B has a surface roughness larger than the surface roughness of the first layer 8A. Hence, in the case where the supporting member 1 includes the adhesive layer, the adhesion when the adhesive layer is in contact with the first layer 8A is stronger than the adhesion when the adhesive layer is in contact with the second layer 8B.

The adhesion is weak between the second layer 8B having a large surface roughness and the adhesive layer of the supporting member 1. Hence, if the light-transmissive sheet 8 is divided with the surface of the second layer 8B being in contact with the adhesive layer of the supporting member 1, the light-transmissive members 50 formed through cutting may come off the supporting member 1 and may be scattered.

On the other hand, the adhesion is strong between the first layer 8A having a small roughness and the adhesive layer of the supporting member 1. Hence, if the light-transmissive sheet 8 is divided with the surface of the first layer 8A being in contact with the adhesive layer of the supporting member 1, scattering of the light-transmissive members 50 is suppressed. The light-transmissive members can be easily manufactured in this way.

The adhesion is weak between the second layer 8B having a large surface roughness and the adhesive layer of the supporting member 1. Hence, if the light-transmissive sheet 8 is divided with the surface of the second layer 8B being in contact with the adhesive layer of the supporting member 1, cutting chips of the second layer 8B easily come off the crevice and are easily scattered. On the other hand, the adhesion is strong between the first layer 8A having a small roughness and the adhesive layer of the supporting member 1. Hence, if the light-transmissive sheet 8 is divided with the surface of the first layer 8A being in contact with the adhesive layer of the supporting member 1, cutting chips of the first layer 8A tend to be integrated with cutting chips of the adhesive layer. The cutting chips of the first layer 8A integrated with that of the adhesive layer tend to remain near the crevice and are not easily scattered. In other words, the removability of the cutting chips may be lowered. Accordingly, it is preferable to include ejecting of cutting chips remaining in or near the crevice by further moving the blade within the crevice after dividing the light-transmissive sheet 8, as described later.

Figure 2A:
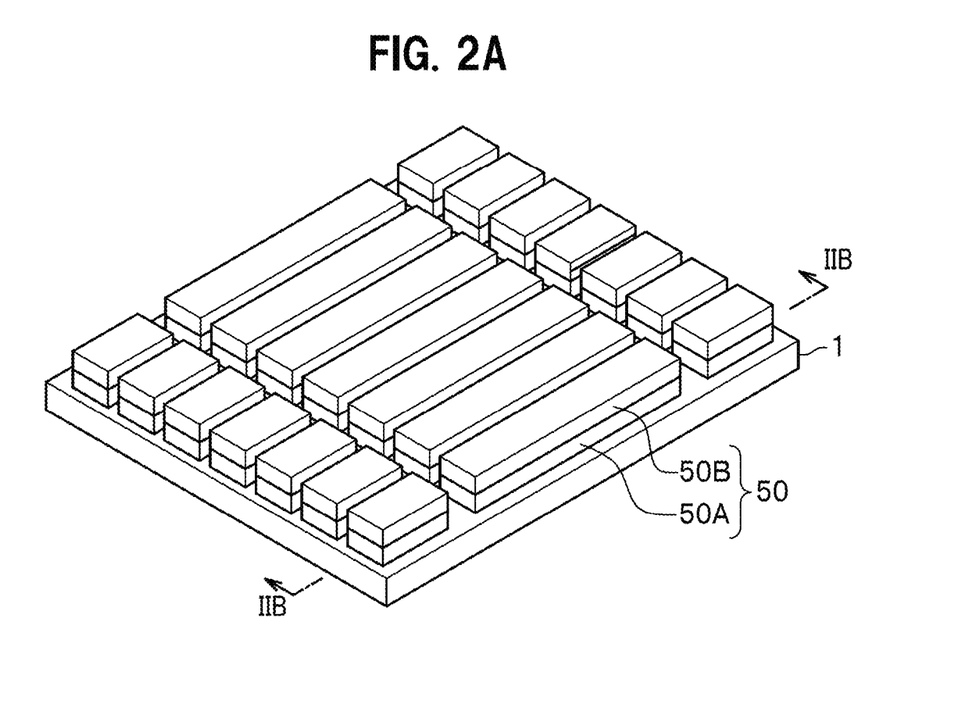
FIG. 2A is a schematic perspective view of light-transmissive members according to the present embodiment.

FIG. 2A shows a plurality of light-transmissive members 50 formed over the supporting member 1. Specifically, FIG. 2A is an enlarged view of an illustrative portion of the supporting member 1 and shows seven light-transmissive members 50 and portions of 14 light-transmissive members 50 on both sides of the seven light-transmissive members 50. The light-transmissive members 50 each include, for example, a phosphor-free portion 50A and a phosphor-containing portion 50B in that order layered from the supporting member 1.

The phosphor-free portion 50A is formed by separation of the first layer 8A of the light-transmissive sheet 8 by crevices over the supporting member 1. The phosphor-free portion 50A contains substantially no phosphor and is made of the matrix of the light-transmissive member.

The phosphor-containing portion 50B is formed by separation of the second layer 8B of the light-transmissive sheet 8 by crevices over the supporting member 1. The phosphor-containing portion 50B includes the matrix of the light-transmissive member and the phosphor mixed in the matrix.

A wet or dry cutting device can be used. In the case of a wet cutting device, the cutting chips can be removed by water. In the case of a dry cutting device, the cutting chips can be removed by suction. Either of the cutting devices can be selected appropriately depending on the type of the phosphor and the like.

For example, in the case where the second layer 8B of the light-transmissive sheet 8 contains a manganese-activated fluoride phosphor, the dry cutting device is preferably used. This is because manganese-activated fluoride phosphors have a property of being easily deteriorated by water although these phosphors are preferable for use in a light-emitting device having high color reproducibility because emission of light having a comparatively narrow spectral linewidth can be obtained. Hence, use of a dry cutting device 80 as shown in FIG. 3A can reduce deterioration of the manganese-activated fluoride phosphor due to water including cutting water and/or cooling water.

Figure 3A:
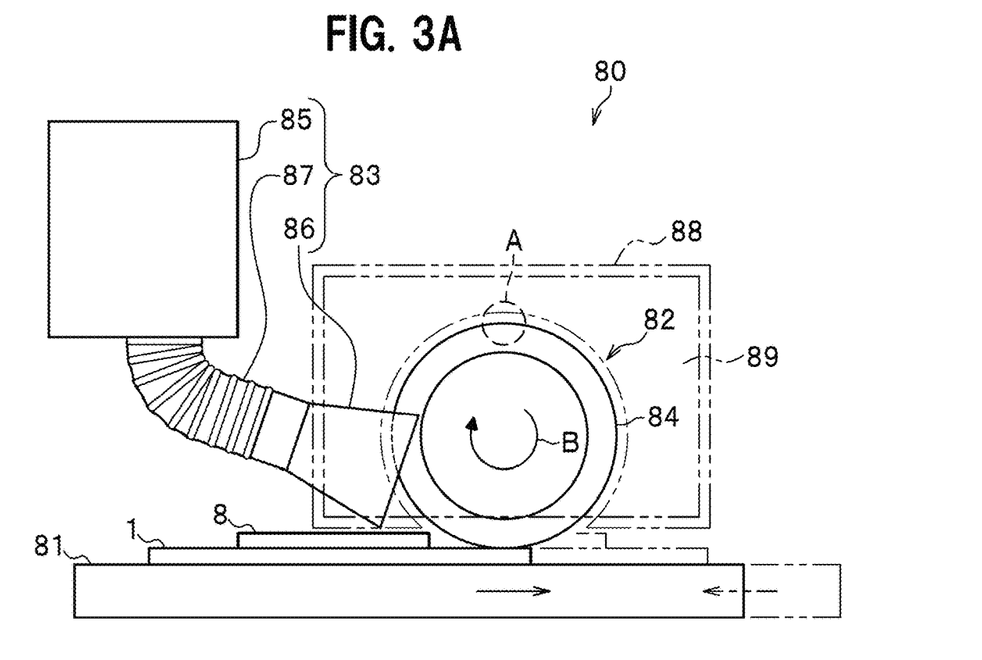
FIG. 3A is a schematic view of a cutting device that divides the light-transmissive sheet in a method for manufacturing a light-transmissive member according to the present embodiment.
Figure 3B:
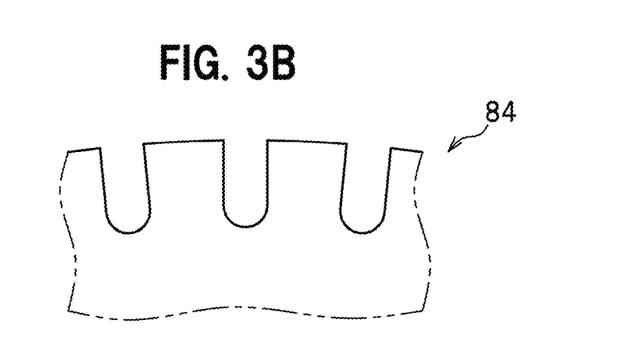
FIG. 3B is a schematic enlarged view of the portion A of a blade in FIG. 3A.
Figure 3C:
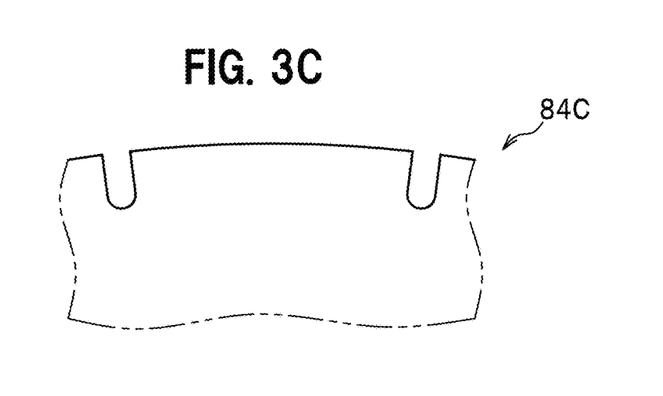
FIG. 3C is a schematic view of a blade.

As shown in FIG. 3A to FIG. 3C, the cutting device 80 includes, for example, a stage 81, a spindle unit 82, and a suction mechanism 83. The cutting device 80 includes a body unit 88 provided with the spindle unit 82, and a cover 89 bonded to the body unit 88 to prevent cutting chips from being scattered during dividing.

The stage 81 is a member on which the supporting member 1 is disposed, and is movable in the X and Y directions. The spindle unit 82 includes a rotary blade having a circular profile as the blade 84. The suction mechanism 83 is disposed adjacent to the blade 84. The suction mechanism 83 suctions cutting chips generated by dividing of the light-transmissive sheet 8 with the blade 84. The suction mechanism 83 includes, for example, a dust collector 85, an intake port unit 86, and a hose 87. The lower end of an intake opening of the intake port unit 86 is close to the blade 84. The intake opening is wide in a lateral view and the intake port unit 86 becomes narrower toward the inner end. The intake opening of the intake port unit 86 covers the blade 84 from its lower end to the center. The hose 87 connects the intake port unit 86 to the dust collector 85. The cover 89 covers the spindle unit 82 and the intake port unit 86 of the suction mechanism 83. Use of the above suction mechanism 83 improves the ejectability of the cutting chips and saves labor and time of manufacturing the light-transmissive member.

In the cutting device 80, the blade 84 is rotated, and the stage 81 is moved in the X and Y directions. Part of the light-transmissive sheet 8 is removed by dividing with the blade 84 to form the block-like light-transmissive members 50 disposed separated from one another.

The feed rate of the stage 81 can be appropriately adjusted depending on the material of the light-transmissive sheet 8 and the like. The feed rate is about ten times as large as the feed rate in cutting a substrate or the like. For example, in the case where the feed rate in cutting a substrate is 10 mm/sec, the feed rate of the light-transmissive sheet 8 is, for example, 100 mm/sec.

The thickness of the blade 84 is set to the same value as a desired thickness of the crevices. The thickness is preferably small in view of the number of light-transmissive members 50 obtained from one light-transmissive sheet 8, but the thickness is preferably larger than the thickness of a push-cutter in order to form the crevices.

In the case where manufacture of the light-transmissive members is performed as one of steps in manufacture of light-emitting devices, for example, it is required to ensure the crevices having a width large enough to allow the manufactured light-transmissive members to be handled in a subsequent step. For example, the distance between adjacent light-transmissive members is preferably 50 μm or more to prevent, when one light-transmissive member is pushed up form below the supporting member 1, an adjacent light-transmissive member from being loose and causing trouble. In other words, the thickness of the blade 84 is preferably 50 μm or more.

The rotation rate of the blade 84 can be set appropriately depending on the specifications of the cutting device 80. For example, if the rotation rate is too high, the rotary blade may move in a zigzag line or may be broken. If the rotation rate is too low, the number of hits of the rotary blade on the light-transmissive sheet 8 per unit time is small, and the ejectability of the cutting chips is lowered. Hence, the rotation rate is set such that good ejectability of the cutting chips is achieved. Examples of such a rotation rate include 38,000 to 42,000 rpm.

FIG. 3B shows an example of the blade 84 of a dry cutting device. FIG. 3C shows an example of a blade 84C of a wet cutting device. The blade 84 of the dry cutting device shown in FIG. 3B preferably has slits having a depth of 1.5 times to twice as large as the depth in the blade 84C of the wet cutting device shown in FIG. 3C at small intervals of equal to or less than half (⅓ to ¼) of the slit intervals of the blade 84C. This structure facilitates swirling up of the cutting chips by catching the cutting chips with the slits and improves the ejectability of the resin chips. Also, because this structure has high heat dissipation performance, the blade is kept at a comparatively low temperature. Hence, softening of the light-transmissive sheet 8 due to heat of the blade is prevented, thereby reducing the risk that cutting by dividing gets difficult. Accordingly, the light-transmissive sheet 8 is easily cut by dividing.

When the light-transmissive sheet 8 is divided over the supporting member 1 with the blade 84, the supporting member 1 below the light-transmissive sheet 8 may be divided together, or the supporting member 1 may not be divided. In the present embodiment, an example is described in which the supporting member 1 is divided together with the light-transmissive sheet 8. In this case, the supporting member 1 is not separated, but grooves are formed longitudinally and laterally in the supporting member 1.

A brittle material that is easily reduced to a powder (fine chips) is preferable for the material constituting the supporting member 1 because dust is easily collected and removed. Examples of the material include polyolefin resins such as poly(ethylene terephthalate) (PET), polyethylene (PE), and polypropylene (PP). Among these, PP tends to generate linear (thready) cutting chips. Because the linear cutting chips adhere closely to the adhesive layer of the supporting member 1 that has been cut together, the cutting chips easily adhere again. On the other hand, PET generates finer powdery cutting chips. Hence, in the case where the supporting member 1 is divided together with the light-transmissive sheet 8, PET is preferable in view of suction and ejection of the cutting chips.

Figure 4:
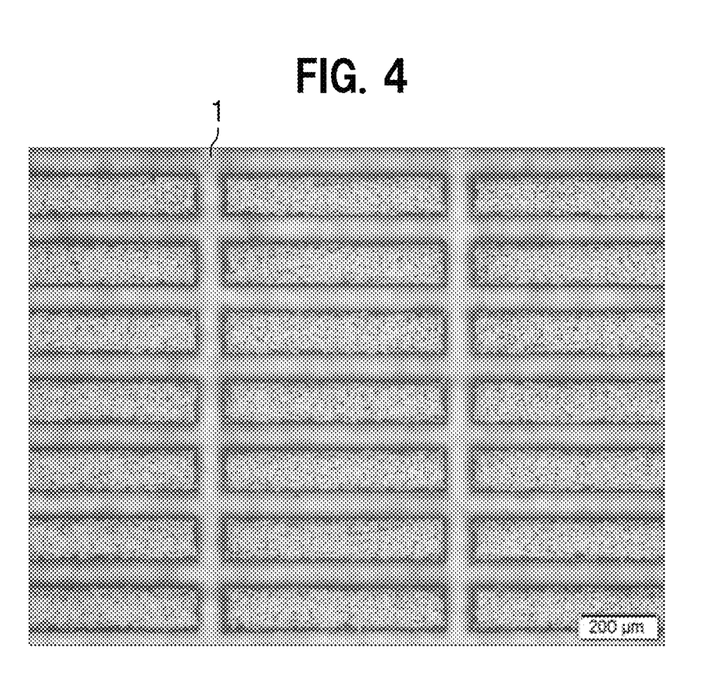
FIG. 4 is a schematic view of the light-transmissive members from which cutting chips have been ejected.
Figure 5:
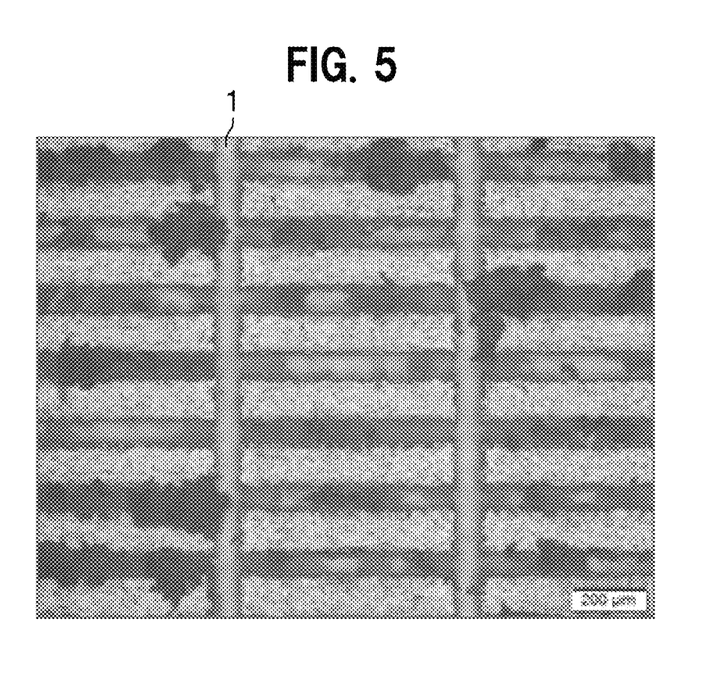
FIG. 5 is a schematic view of the light-transmissive members on which cutting chips have accumulated.

The blade 84 may rotate in any direction but preferably rotates in a direction from the supporting member 1 toward the light-transmissive sheet 8. That is, the blade 84 preferably rotates in the direction indicated by the arrow B (clockwise) in FIG. 3A. If the blade 84 rotates in the direction indicated by the arrow B (clockwise) in FIG. 3A, the cutting chips are swirled up from below, and the cutting chips are prevented from sticking in the supporting member 1. Also, because the intake port unit 86 of the suction mechanism 83 is disposed at the destination of the swirled-up cutting chips, the cutting chips are suctioned without being scattered. Accordingly, good ejection of the cutting chips is achieved as shown in FIG. 4, and mass production is enhanced.

In the present embodiment, the rotary blade is used to cut the light-transmissive sheet 8 so that crevices are formed by dividing the light-transmissive sheet 8. In other words, the light-transmissive members are disposed separated from one another while providing the separated light-transmissive members. Hence, separating of the light-transmissive members is not required.

Also, because the separating of the light-transmissive members is not required, the second step may be repeated twice or more using the time saved. In other words, the operation of rotating the blade 84 while moving, in the X and Y directions along the same path, the stage 81 carrying the light-transmissive sheet 8 that has already been separated into the light-transmissive members over the supporting member 1 may be repeated. For example, in the case where the second step is repeated twice, the cutting chips can be ejected by dividing the light-transmissive members 50 to separate the light-transmissive members 50 from one another in the first round and then blowing off and removing the remaining cutting chips in the second round.

«Light-Emitting Device 100»

Figure 6A:
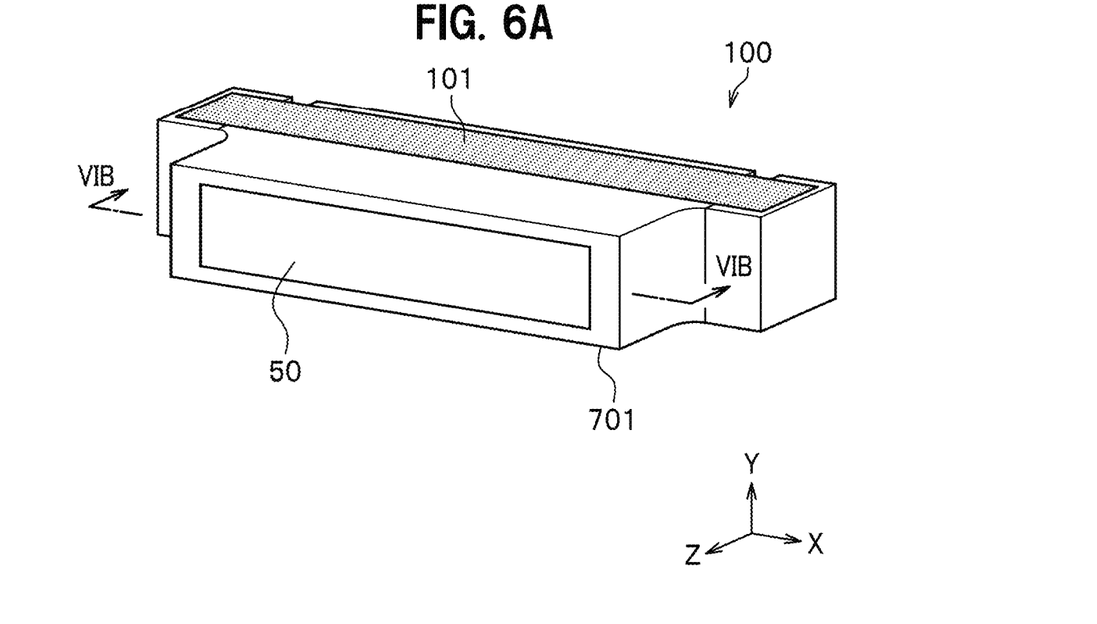
FIG. 6A is a schematic perspective view of a light-emitting device according to the present embodiment.
Figure 6B:
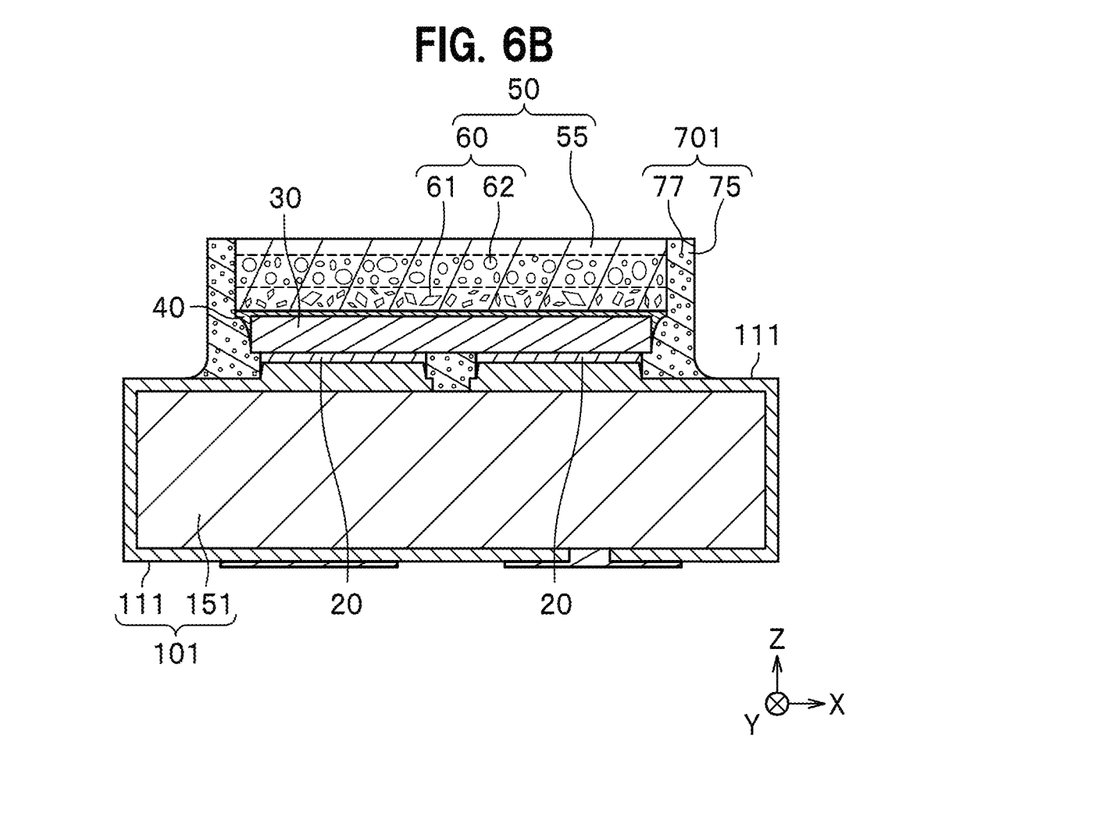
FIG. 6B is a schematic cross-sectional view of the light-emitting device according to the present embodiment taken along the line VIB-VIB in FIG. 6A.

Subsequently, the light-emitting device 100 according to the present embodiment will be described referring to FIG. 6A and FIG. 6B. In FIG. 6A and FIG. 6B, the width direction of the light-emitting device 100 is the X direction, the thickness direction is the Y direction, and the front-back (depth) direction is the Z direction. These X, Y, and Z directions (axes) are each perpendicular to the other two directions (axes). More particularly, the right direction is the X+ direction, the left direction is the X− direction, the upper direction is the Y+ direction, the lower direction is the Y− direction, the front direction is the Z+ direction, and the back direction is the Z− direction. The Y− direction is the mounting direction of the light-emitting device 100. The Z+ direction is the main emitting direction of the light-emitting device 100.

(Light-Emitting Device 100)

The light-emitting device 100 is, for example, a light-emitting diode (LED). The light-emitting device 100 in the present embodiment is a side-view device but can be replaced by a top-view device. In a side-view light-emitting device, the mounting direction is perpendicular to the main emitting direction. In a top-view light-emitting device, the mounting direction is parallel to the main emitting direction. The shape in a front view, that is, the shape taken from the main emitting direction, of the light-emitting device can be selected appropriately, but a rectangular shape is preferable in terms of mass production. In particular, the shape in a front view in the case of the side-view light-emitting device is preferably a rectangle having a longitudinal direction and a short direction. The shape in a front view in the case of the top-view light-emitting device is preferably a square or a rectangle.

As shown in FIG. 6A and FIG. 6B, the light-emitting device 100 according to the present embodiment includes a substrate piece 101, electrically-conductive adhesive members 20, a light-emitting element 30, a light-guiding member 40, the light-transmissive member 50, and a light-reflective covering member 701. In the present specification, the front surface of the light-transmissive member 50 and the front surface of the covering member 701 constitute substantially the same surface.

Wirings 111 are obtained by separating wirings 11 (see FIG. 7) described later. A base 151 is obtained by separating a base 15 (see FIG. 7) described later. The covering member 701 is obtained by separating a covering member 70 (see FIG. 8D and the like) described later. The light-emitting element 30 includes a first light-emitting element 31 or a second light-emitting element 32 (see FIG. 8A) described later. The light-transmissive member 50 is obtained by separating the light-transmissive sheet 8 (see FIG. 1A and the like). In the present specification, the second layer 8B of the light-transmissive sheet 8 includes a plurality of layers each containing different phosphors. The light-transmissive member 50 includes a first light-transmissive member 51 or a second light-transmissive member 52 (see FIG. 8B) described later.

The light-emitting device 100 having such a structure is, for example, soldered to a circuit board via external-connecting terminal portions of positive and negative electrodes of the wirings 111 and emits light if electricity is fed through a circuit. At this time, the high light reflectance of the covering member 701 deflects forward much of light laterally emitted from the light-emitting element 30 and the light-transmissive member 50, and the main emitting region of the light-emitting device 100 is thus the front surface of the light-transmissive member 50. The light-emitting device 100 will be described below in more detail.

(Substrate 10 and Substrate Piece 101)

A substrate 10 includes at least wirings and a base supporting the wirings. In addition, the substrate 10 may include an insulating protective film such as a solder mask and a coverlay. The same applies to the substrate piece 101. The thickness of the substrate 10 and the substrate piece 101 is, for example, in a range of 0.02 to 1 mm, preferably 0.05 to 0.3 mm in view of the strength of the substrate 10 and the substrate piece 101 and the thickness of the light-emitting device.

(Wirings 11 and 111)

The wirings 11 or 111 are formed at least on the upper surface (front surface) of the base 15 or 151 and may be formed inside and/or on the lateral surface and/or on the lower surface (back surface) of the base 15 or 151. The wirings 11 or 111 preferably include element-connecting terminal portions on which the light-emitting element 30 is mounted, the external-connecting terminal portions connected to external circuits, and portions that function as lead wiring portions connecting these terminal portions. The wirings 11 or 111 can be formed of copper, iron, nickel, tungsten, chromium, aluminum, silver, gold, titanium, palladium, rhodium, or alloys of these metals. A layer or a plurality of layers of these metals or alloys of these metals may be used. In particular, copper or a copper alloy is preferable in view of heat dissipation performance. Surface layers of the wirings 11 or 111 may be layers of materials such as silver, platinum, aluminum, rhodium, gold, and alloys of these metals in view of wettability and/or light reflectivity of bonding members.

(Bases 15 and 151)

In the case of a rigid substrate, the base 15 or 151 can include a resin or a fiber-reinforced resin, a ceramic, glass, metal, paper, or the like. Examples of the resin or the fiber-reinforced resin include epoxy resins, glass epoxy resins, bismaleimide-triazine (BT) resins, and polyimides. Examples of the ceramic include aluminum oxide, aluminum nitride, zirconium oxide, zirconium nitride, titanium oxide, titanium nitride, and mixtures of these materials. Examples of the metal include copper, iron, nickel, chromium, aluminum, silver, gold, titanium, and alloys of these metals. In the case of a flexible substrate, the base 15 or 151 can include a polyimide, poly(ethylene terephthalate), poly (ethylene naphthalate), a liquid crystal polymer, a cycloolefin polymer, or the like. Among these base materials, use of a base material having physical properties similar to the linear expansion coefficient of the light-emitting element is preferable.

(Electrically-Conductive Adhesive Members 20)

Any one of bumps of gold, silver, copper, or the like; a metal paste containing powder of a metal such as silver, gold, copper, platinum, aluminum, and palladium and a resin binder; a tin-bismuth, tin-copper, tin-silver, or gold-tin solder or the like; and a brazing filler metal such as a low-melting-point metal can be used as the electrically-conductive adhesive members 20.

(Light-Emitting Element 30, First Light-Emitting Element 31, and Second Light-Emitting Element 32)

The light-emitting element 30 includes a semiconductor layered body. The light-emitting element 30 may include an element substrate. Examples of the light-emitting element include LED chips. The shape of the light-emitting element in a front view is preferably a rectangle, particularly a square or a rectangle that is long in one direction, but other shapes are also possible. For example, polygons such as hexagons are also possible. The lateral surfaces of the light-emitting element may be perpendicular to the front surface or may be inclined. The light-emitting element preferably has positive and negative (p− and n−) electrodes on the same surface. One or a plurality of light-emitting elements may be mounted on one light-emitting device. A plurality of light-emitting elements can be connected in series or in parallel. The semiconductor layered body includes an n-type semiconductor layer, a p-type semiconductor layer, and an active layer. The light-emitting element 30 may include an insulating film and the like. A nitride semiconductor, which can emit short-wavelength light that can efficiently excite the phosphor, is preferably used as the semiconductor material. The nitride semiconductor is typically represented by the general formula $In_xAl_yGa_{1-x-y}N$ ($0 \leq x$, $0 \leq y$, $x+y \leq 1$). The emission peak wavelength of the light-emitting element is preferably in a range of 400 nm to 530 nm, more preferably 420 nm to 490 nm, even more preferably 450 nm to 475 nm, in view of light-emission efficiency, excitation of the phosphor, color mixing relations with light emission of the phosphor, and the like.

(Light-Guiding Member 40)

The light-guiding member 40 bonds the light-emitting element 30 to the light-transmissive member 50 and guides light from the light-emitting element 30 to the light-transmissive member. Examples of the matrix of the light-guiding member 40 include silicone resins, epoxy resins, phenolic resins, polycarbonate resins, acrylic resins, and modified resins of these resins. Among these resins, silicone resins and modified silicone resins have good heat and light resistance and are thus preferable. Specific examples of the silicone resins include dimethyl silicone resins, phenyl-methyl silicone resins, and diphenyl silicone resins. A filler similar to a filler in the matrix of the light-transmissive member described later may be mixed in the matrix of the light-guiding member 40. The "modified resins" in the present specification include hybrid resins.

(Light-Transmissive Member 50, First Light-Transmissive Member 51, and Second Light-Transmissive Member 52)

The light-transmissive member 50 includes, for example, a first phosphor layer containing a matrix 55 and a first phosphor 61, a second phosphor layer containing the matrix 55 and a second phosphor 62, and a light-transmissive resin layer containing the matrix 55, in that order layered from the light-emitting element 30.

Figure 2B:
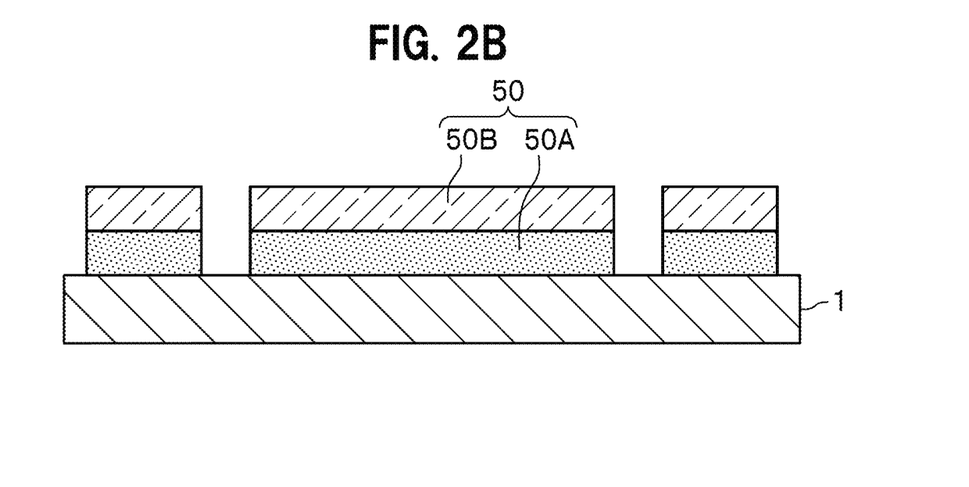
FIG. 2B is a schematic cross-sectional view of the light-transmissive members according to the present embodiment taken along the line IIB-IIB in FIG. 2A.

The light-transmissive resin layer corresponds to the phosphor-free portion 50A shown in FIG. 2B.

The first phosphor layer corresponds to one layer in the phosphor-containing portion 50B shown in FIG. 2B.

The second phosphor layer corresponds to another layer in the phosphor-containing portion 50B shown in FIG. 2B. In other words, the phosphor-containing portion 50B is disposed closer to the light-emitting element 30.

The matrix 55 of the light-transmissive member may contain various fillers mixed in any of the resins or glass described above as the matrix of the light-transmissive sheet 8 (FIG. 1A). Examples of the fillers include silicon oxide, aluminum oxide, zirconium oxide, and zinc oxide. These fillers can be used singly, or two or more of the fillers can be used in combination. Silicon oxide, which has a small thermal expansion coefficient, is particularly preferable. Using nanoparticles as the filler can increase scattering, including Rayleigh scattering of blue light from the light-emitting element, and reduce the quantity of a wavelength conversion substance used. The nanoparticles are particles having grain diameters in a range of 1 nm to 100 nm. The "grain diameter" in the present specification is defined as, for example, D50.

(Phosphor 60, First Phosphor 61, and Second Phosphor 62)

A phosphor 60 is a member that absorbs at least part of primary light emitted from the light-emitting element 30 and converts the light into secondary light differing from the primary light in wavelengths ("phosphor" may also be referred to as a "wavelength conversion substance"). This structure can provide a light-emitting device that emits mixed light, such as white light, of the primary light and the secondary light both having visible wavelengths.

The first phosphor 61 and the second phosphor 62 can be appropriately selected from the above specific examples of the phosphor mixed in the matrix of the light-transmissive sheet 8 (FIG. 1A). For example, the first phosphor 61 can be a green- or yellow-emitting phosphor, and the second phosphor 62 can be a red-emitting phosphor. In the present specification, for example, the second phosphor 62 is supposed to be a manganese-activated fluoride phosphor.

(Light-Reflective Covering Members 70 and 701)

The light reflectance of the light-reflective covering member 70 or 701 at the emission peak wavelength of the light-emitting element 30 is preferably 70% or more, more preferably 80% or more, even more preferably 90% or more, in view of forward light extraction efficiency. In addition, the covering member 70 or 701 is preferably white. Thus, the covering member 70 or 701 preferably contains a white pigment in the matrix. The covering member 70 or 701 goes through a fluid state before being cured. The covering member 70 or 701 can be formed by transfer molding, injection molding, compression molding, potting, or the like.

(Matrix 75 of Covering Member)

A matrix 75 of the covering member can be a resin, such as silicone resins, epoxy resins, phenolic resins, polycarbonate resins, acrylic resins, and modified resins of these resins. Among these resins, silicone resins and modified silicone resins have good heat and light resistance and are thus preferable. Specific examples of the silicone resins include dimethyl silicone resins, phenyl-methyl silicone resins, and diphenyl silicone resins. The matrix 75 of the covering member may contain a filler similar to the above filler in the matrix of the light-transmissive member.

(White Pigment 77)

As a white pigment 77, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used singly, or two or more of these pigments can be used in combination. The shape of the white pigment is not limited to particular shapes. The shape may be indefinite or crushed, but is preferably spherical in view of fluidity. The grain diameter of the white pigment 77 is in a range of, for example, about 0.1 µm to 0.5 µm, and smaller grain diameters are preferable to enhance effects of light reflection and covering. The content of the white pigment in the light-reflective covering member can be appropriately selected. In view of light reflectivity, the viscosity in a fluid state, and the like, the content is preferably in a range of, for example, 10 wt % to 80 wt %, more preferably 20 wt % to 70 wt %, even more preferably 30 wt % to 60 wt %. The term "wt %" means percentage by weight, that is, the proportion of the weight of a material of interest to the total weight of the light-reflective covering member.

«Method for Manufacturing Light-Emitting Device 100»

Subsequently, a method for manufacturing a light-emitting device 100 according to the present embodiment will be described referring to FIG. 7 to FIG. 8E. The X, Y, and Z directions in FIG. 7 to FIG. 8E respectively correspond to the X, Y, and Z directions in FIG. 6A and FIG. 6B. In the present specification, two light-emitting elements (the first light-emitting element 31 and the second light-emitting element 32) and two light-transmissive members (the first light-transmissive member 51 and the second light-transmissive member 52) typify a plurality of light-emitting elements and a plurality of light-transmissive members disposed on the substrate 10.

Figure 7:
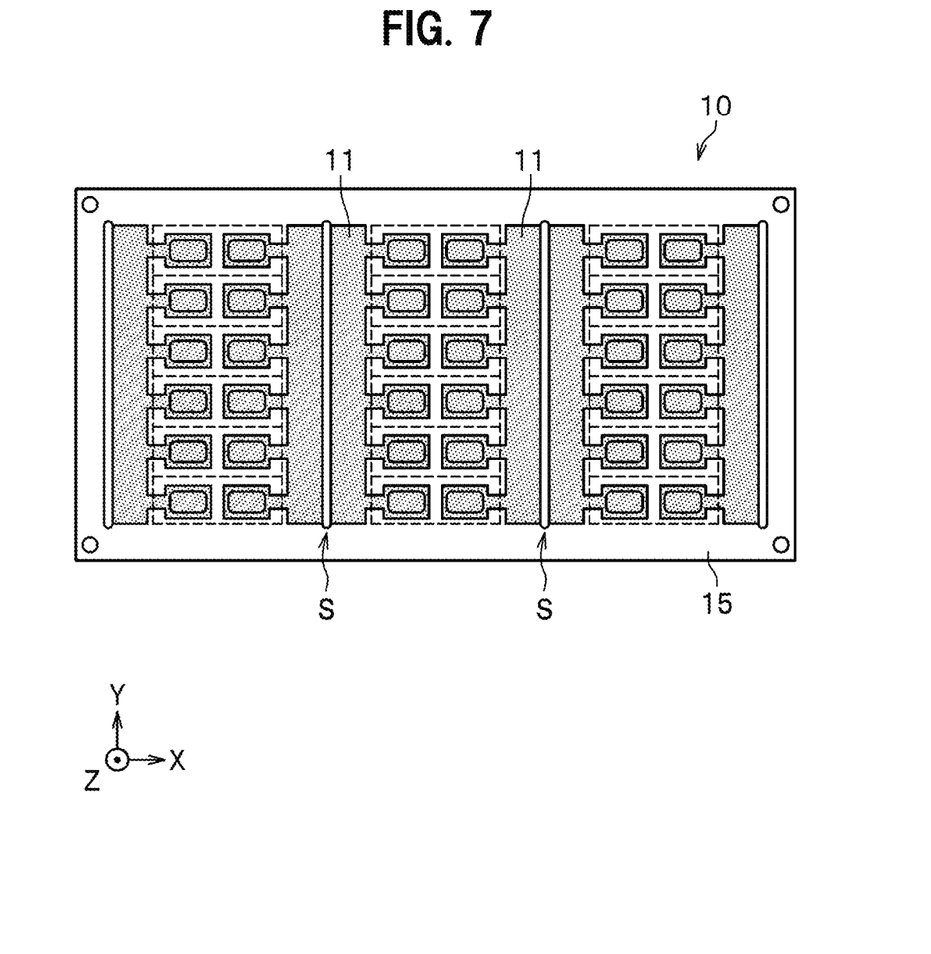
FIG. 7 is a schematic plan view of an illustrative substrate used in manufacture of the light-emitting device according to the present embodiment.

As shown in FIG. 7, the substrate 10 is cut into a plurality of substrate pieces 101 which respectively serve as light-emitting devices. The substrate 10 includes the wirings 11 and the base 15 supporting the wirings 11. The base 15 has, at regular intervals in the X direction, a plurality of long through-holes S that penetrate from the upper surface to the lower surface and that are long in the Y direction. On the upper surface of the substrate 10, light-emitting elements including the first light-emitting element 31 and the second light-emitting element 32 described later are mounted in a region between two long through-holes S, more specifically, on the central portion of the region. The wirings 11 include positive and negative element-connecting terminal portions on the central portion of the upper surface of the base 15 in the region between the two long through-holes S. In the region between the two long through-holes S, the wirings 11 include positive and negative external-connecting terminal portions extending from left and right end portions of the upper surface of the base 15 to left and right end portions of the lower surface through lateral surfaces of the long through-holes S. In addition, the lead wiring portions that connect these terminal portions are included on the upper surface of the base 15. As described above, the region between the two long through-holes S of the substrate 10 includes a plurality of substrate pieces 101, which respectively serve as light-emitting devices, connected to one another in the Y direction. Cutting the region between the two long through-holes S in the X direction achieves separation into substrate pieces 101 each of which serves as a light-emitting device.

The method for manufacturing the light-emitting device 100 according to the present embodiment will be described more specifically referring to FIG. 8A to FIG. 8E. In the method for manufacturing the light-emitting device 100, Step S1 to Step S5 below are performed in the order of the step numbers.

Figure 8A:
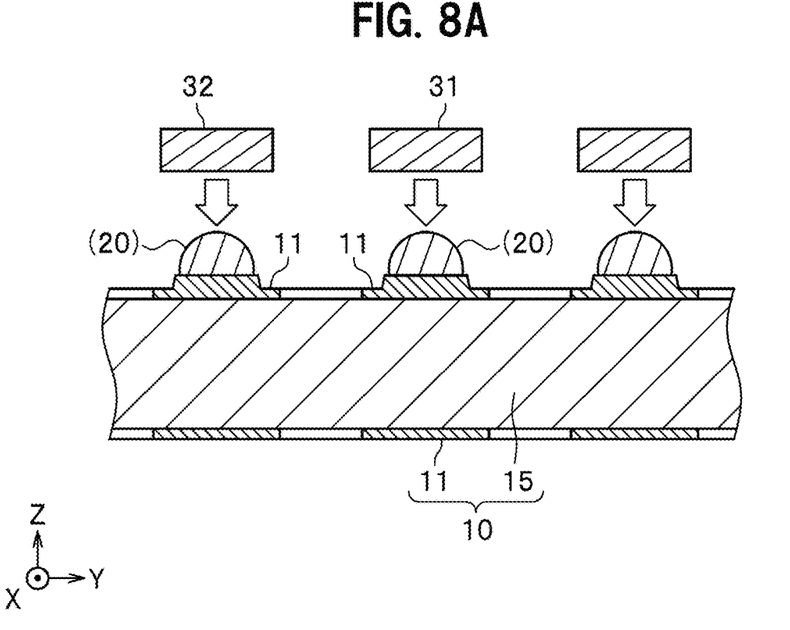
FIG. 8A is a schematic cross-sectional diagram illustrating Step S1 in a method for manufacturing a light-emitting device according to the present embodiment.

In Step S1, the first light-emitting element 31 and the second light-emitting element 32 are flip-chip mounted separately from each other on the substrate 10, as shown in FIG. 8A. That is, positive and negative electrodes of the first light-emitting element 31 and the second light-emitting element 32 are respectively connected to the positive and negative element-connecting terminal portions of the wirings 11 via the electrically-conductive adhesive members 20. At this time, in the case where the first light-emitting element 31 and the second light-emitting element 32 have rectangular shapes in a top view, the first light-emitting element 31 and the second light-emitting element 32 are mounted preferably such that two lateral surfaces facing each other are substantially parallel to the X direction and that the other two lateral surfaces facing each other are substantially parallel to the Y direction. More specifically, for example, electrically-conductive adhesive members (20) as a paste are applied to the positive and negative element-connecting terminal portions, the first light-emitting element 31 and the second light-emitting element 32 are disposed thereon, and the electrically-conductive adhesive members (20) are molten by heat treatment in a reflow oven or the like and then solidified by cooling. Note that reference numerals in parentheses in the present specification and the drawings mean that the components are in states before their final forms.

Figure 8B:
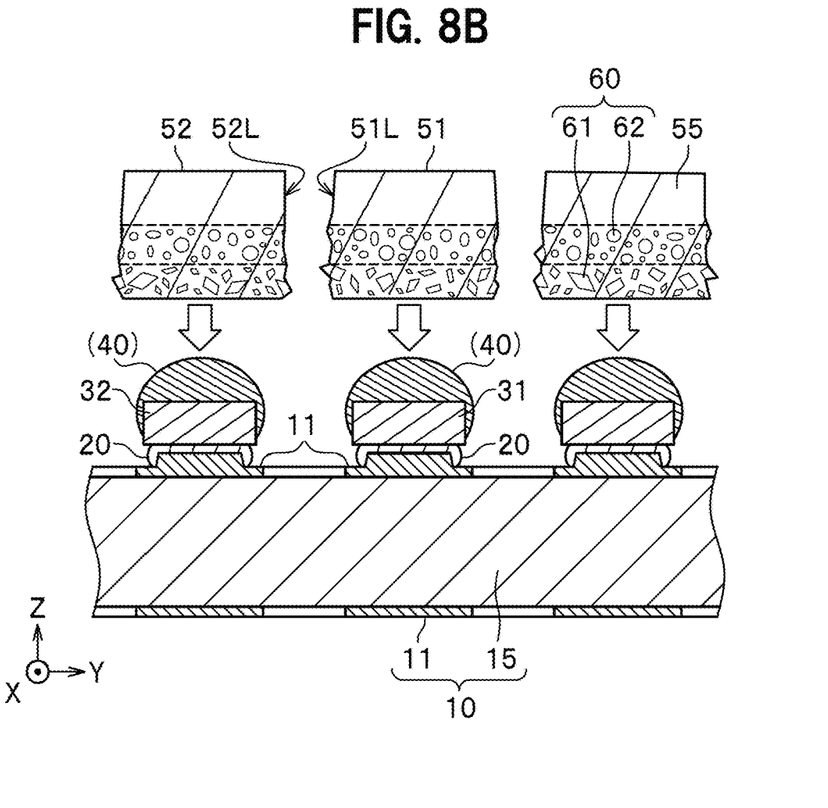
FIG. 8B is a schematic cross-sectional diagram illustrating Step S2 in the method for manufacturing a light-emitting device according to the present embodiment.

In Step S2 after Step S1, the first light-transmissive member 51 having a lateral surface 51L and the second light-transmissive member 52 having a lateral surface 52L are respectively bonded to the first light-emitting element 31 and the second light-emitting element 32 such that the lateral surface 52L is disposed separated from and face the lateral surface 51L, as shown in FIG. 8B. The first light-transmissive member 51 and the second light-transmissive member 52 are produced separately by the above method for manufacturing a light-transmissive member. At the time of mounting the first light-transmissive member 51 and the second light-transmissive member 52 respectively on the first light-emitting element 31 and the second light-emitting element 32, the first phosphor layers (phosphor-containing portions 50B) of the first light-transmissive member 51 and the second light-transmissive member 52 are disposed closer to the first light-emitting element 31 and the second light-emitting element 32. This structure enables the first phosphor layers and the second phosphor layers (phosphor-containing portions 50B) to be protected by the light-transmissive resin layers (phosphor-free portions 50A) after completion of the light-emitting device 100. In other words, the effect of reducing the risk of deterioration of the phosphor layers is produced.

In the case where the first light-transmissive member 51 and the second light-transmissive member 52 having rectangular shapes in a top view are respectively mounted on the first light-emitting element 31 and the second light-emitting element 32 having the same shapes as the first light-transmissive member 51 and the second light-transmissive member 52 in a top view in Step S2, the bonding is performed preferably such that the lateral surfaces of the first light-transmissive member 51 and the second light-transmissive member 52 are substantially parallel to the respective lateral surfaces of the first light-emitting element 31 and the second light-emitting element 32. More specifically, for example, light-guiding members (40) as a fluid are applied to the first light-emitting element 31 and the second light-emitting element 32 mounted on the substrate 10, the first light-transmissive member 51 and the second light-transmissive member 52 are disposed thereon, and the light-guiding members (40) are cured by heat treatment in an oven or the like. A "fluid" in the present specification includes a sol and a slurry.

Figure 8C:
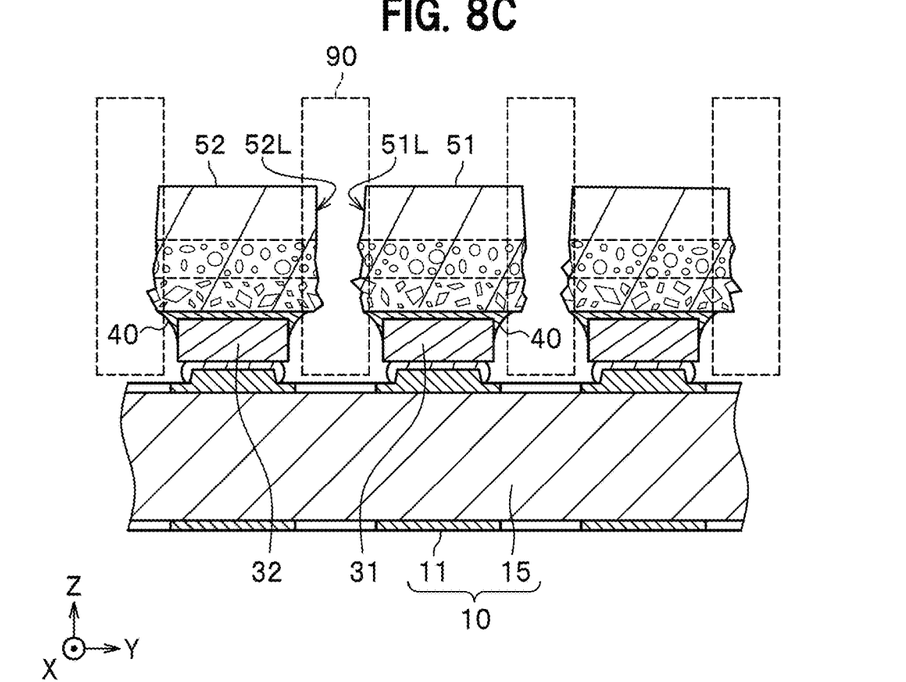
FIG. 8C is a schematic cross-sectional diagram illustrating Step S3 in the method for manufacturing a light-emitting device according to the present embodiment.

In Step S3 after Step S2, the lateral surface 51L of the first light-transmissive member 51 and/or the lateral surface 52L of the second light-transmissive member 52 is scraped to expose a scraped lateral surface 51LS and/or a scraped lateral surface 52LS, as shown in FIG. 8C. In other words, the light-transmissive members 50 are shaped by scraping the lateral surfaces of the unshaped light-transmissive members 50 (the first light-transmissive member 51 and the second light-transmissive member 52) in this step. More specifically, for example, a cutting tool 90 that is a disc-shaped rotary blade is set at a predetermined position in the Y direction, that is, at a position at which the blade of the cutting tool 90 has contact with at least one of the lateral surface 51L and the lateral surface 52L, with the edge of the blade being parallel to the X direction, and the cutting tool 90 travels in the X direction on the substrate 10 with the cutting tool 90 being disposed separated from the upper surface of the substrate 10. The scraped lateral surface 51LS is a lateral surface of the light-transmissive member exposed after scraping the lateral surface 51L of the first light-transmissive member. The scraped lateral surface 52LS is a lateral surface of the light-transmissive member exposed after scraping the lateral surface 52L of the second light-transmissive member.

In Step S3, the cutting tool 90 used preferably has a thickness larger than the gap between the lateral surface 51L and the lateral surface 52L at the time Step S2 has been competed, as shown in FIG. 8C. This structure enables scraping of the lateral surface 51L and the lateral surface 52L with one cutting tool 90 at once. Accordingly, the gap between the scraped lateral surface 51LS and the scraped lateral surface 52LS is easily controlled, and thus the thickness of the covering member 70 to be charged in the gap is easily controlled. In addition, the lateral surface 51L and the lateral surface 52L can be scraped with fewer man-hours. Directly covering projections on the lateral surface 51L and the lateral surface 52L with the light-reflective covering member 70 forms light confining regions, which tend to result in losses of light. Thus, it is preferable to scrape these projections in Step S3 to level the scraped lateral surface 51LS and/or the scraped lateral surface 52LS.

To obtain a preferable thickness of the covering member 70 described later, the gap between the scraped lateral surface 51LS and the scraped lateral surface 52LS is preferably set in the following range. The lower limit is preferably 0.05 mm or more, more preferably 0.07 mm or more, in view of efficient extraction of light toward the front direction of the device while suppressing lateral light leakage. The upper limit is preferably 0.4 mm or less, more preferably 0.32 mm or less, in view of thinning or miniaturizing the light-emitting device.

Scraping the lateral surface 51L and the lateral surface 52L with a dry cutting device can reduce deterioration of the manganese-activated fluoride phosphor (second phosphor 62) due to water including cutting water and/or cooling water.

Figure 8D:
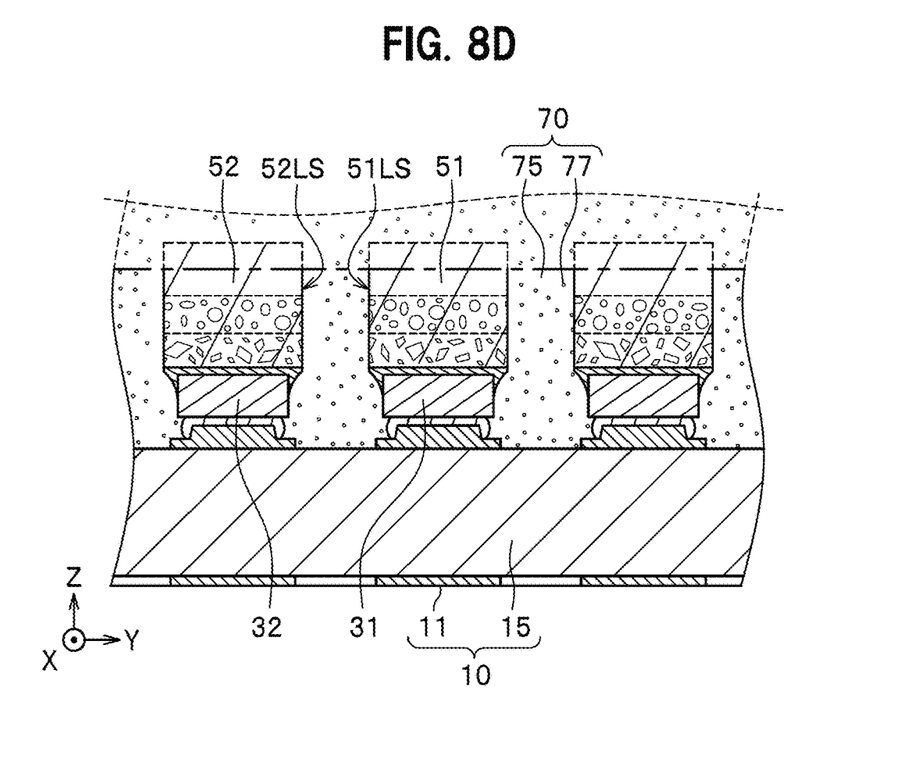
FIG. 8D is a schematic cross-sectional diagram illustrating Step S4 in the method for manufacturing a light-emitting device according to the present embodiment.

In Step S4 after Step S3, the light-reflective covering member 70 is formed on the substrate 10 to cover the lateral surface 51L or the scraped lateral surface 51LS, and the lateral surface 52L or the scraped lateral surface 52LS, as shown in FIG. 8D. More specifically, for example, a fluid covering member 70 is charged around the peripheries of the first light-emitting element 31, the second light-emitting element 32, the first light-transmissive member 51, and the second light-transmissive member 52 on the substrate 10, and the covering member 70 is cured by heat treatment in an oven or the like.

At this time, for example, the first light-transmissive member 51 and the second light-transmissive member 52 are completely embedded in the covering member 70. In Step S4, after forming the covering member 70, the upper surface of the first light-transmissive member 51 and the upper surface of the second light-transmissive member 52 are exposed from the covering member 70 by grinding, blasting, or the like.

The fluid covering member 70 may be charged and cured while pressing the upper surface of the first light-transmissive member 51 and the upper surface of the second light-transmissive member 52 with a mold or the like so that the upper surface of the first light-transmissive member 51 and the upper surface of the second light-transmissive member 52 are exposed. Accordingly, the first light-transmissive member 51 and the second light-transmissive member 52 are completely embedded in the covering member 70.

Figure 8E:
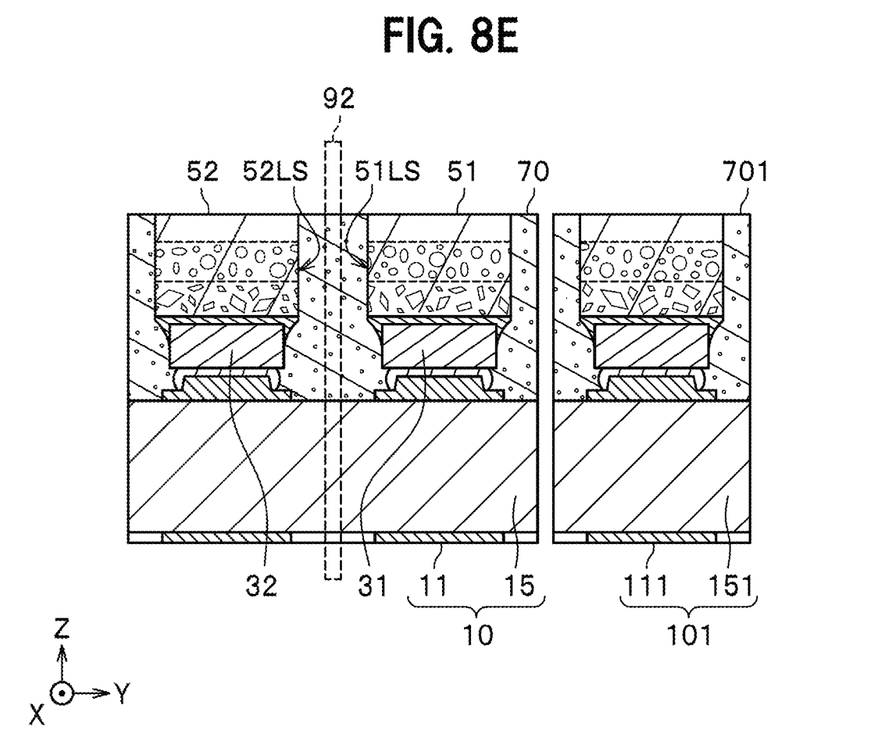
FIG. 8E is a schematic cross-sectional diagram illustrating Step S5 in the method for manufacturing a light-emitting device according to the present embodiment.

In Step S5 after Step S4, the substrate 10 and the covering member 70 are cut between the scraped lateral surface 51LS and the scraped lateral surface 52LS, as shown in FIG. 8E. More specifically, for example, a cutting tool 92 that is a disc-shaped rotary blade is set at the center in the Y direction between the scraped lateral surface 51LS and the scraped lateral surface 52LS, with the cutting tool 92 being parallel to the X direction, and the cutting tool 92 travels in the X direction to cut the substrate 10 and the covering member 70. In Step S5, separation into individual light-emitting devices is achieved, using dividing with the rotary blade and the long through-holes S, by making the rotary blade travel in the X direction because the long through-hole S are provided along the Y direction.

At this time, the substrate 10 and the covering member 70 are cut such that at least one, preferably both, of a portion of the covering member 70 covering the scraped lateral surface 51LS, and another portion of the covering member 70 covering the scraped lateral surface 52LS remains.

In this Step S5, the cutting tool 92 used preferably has a thickness smaller than the gap between the scraped lateral surface 51LS and the scraped lateral surface 52LS at the time Step S4 has been completed in view of ease of ensuring a sufficient thickness of the covering member 70.

In the method for manufacturing the light-emitting device 100 according to the present embodiment, flip-chip mounting of the first light-emitting element 31 and the second light-emitting element 32, in other words, sintering of the electrically-conductive adhesive members 20, is usually performed at a comparatively high temperature such as a temperature higher than the temperature at the time of soldering the light-emitting device 100 to the circuit board or the like. For this reason, deterioration of the first light-transmissive member 51 and the second light-transmissive member 52 due to heat is suppressed by bonding the first light-transmissive member 51 and the second light-transmissive member 52 to the first light-emitting element 31 and the second light-emitting element 32 after flip-chip mounting the first light-emitting element 31 and the second light-emitting element 32. In particular, deterioration of a wavelength conversion substance 60 due to heat is suppressed. Examples of the wavelength conversion substance 60 having a comparatively low heat resistance include manganese-activated fluoride phosphors. In the case where the first light-transmissive member 51 and the second light-transmissive member 52 that have been divided in advance are respectively bonded to the first light-emitting element 31 and the second light-emitting element 32 fixed to the substrate 10, it is difficult to precisely control the gap between the lateral surface 51L and the lateral surface 52L only with bonding techniques. Performing Step S3 in the present embodiment enables precise adjustment of the gap between the light-transmissive members by scraping the lateral surfaces of the light-transmissive members and solves the above problem.

A light-emitting device according to certain embodiments of the present invention can be used for backlight devices for liquid-crystal displays, various lighting apparatuses, large format displays, various displays for advertisements or destination guide, and projectors, as well as for image scanners for apparatuses such as digital video cameras, facsimile machines, copying machines, and scanners.

What is claimed is:

1. A method for manufacturing a light-transmissive member, the method comprising:
    providing a moveable stage, a supporting member disposed on the stage, and a light-transmissive sheet disposed on the supporting member, the light-transmissive sheet comprising:
       a first layer containing substantially no phosphor, and
       a second layer containing a phosphor;
    moving the stage along a path while rotating a rotary blade, such that the rotary blade cuts the light-transmissive sheet and thereby forms a crevice that separates the light-transmissive sheet into a plurality of light-transmissive members without separating the supporting member, such that the plurality of light-transmissive members are disposed on the supporting member, and such that each light-transmissive member comprises:
       a first portion formed by separation of the first layer, the first portion containing substantially no phosphor, and
       a second portion formed by separation of the second layer, the second portion containing a phosphor,
       wherein one of the first portion and the second portion is layered on the other of the first portion and the second portion; and
    subsequently, moving the stage along the same path where the crevice is located while rotating the same rotary blade that was used to cut the light-transmissive sheet, such that the rotary blade blows off cutting chips remaining in or near the crevice without separating the supporting member.

2. The method for manufacturing a light-transmissive member according to claim 1, wherein the supporting member is in contact with the first layer.

3. The method for manufacturing a light-transmissive member according to claim 1,
    wherein the rotary blade rotates in a direction from the supporting member toward the light-transmissive sheet in the dividing of the light-transmissive sheet.

4. The method for manufacturing a light-transmissive member according to claim 1, further comprising suctioning cutting chips produced while cutting the light-transmissive sheet with a suction mechanism disposed adjacent to the rotary blade.

5. The method for manufacturing a light-transmissive member according to claim 1, wherein the phosphor comprises a manganese-activated fluoride phosphor.

6. The method for manufacturing a light-transmissive member according to claim 1, wherein the second layer comprises a plurality of layers, each containing a different phosphor.

7. The method for manufacturing a light-transmissive member according to claim 1,
    wherein the supporting member comprises a UV-curable adhesive, and
    wherein the light-transmissive sheet is disposed on the adhesive.

8. A method for manufacturing a light-emitting device, the method comprising:
    mounting light-emitting elements on a substrate so as to be adjacent to one another:
    mounting light-transmissive members, each manufactured by the method for manufacturing a light-transmissive member according to claim 1, on the light-emitting elements
    scraping each pair of opposing lateral surfaces of the light-transmissive members with a cutting tool, such that both opposing lateral surfaces are scraped at once by the cutting tool;
    forming a light-reflective covering member on the substrate to cover each pair of the scraped opposing lateral surfaces, such that upper surfaces of the light-transmissive members are exposed from the covering member;
    cutting the substrate and the covering member between each pair of the scraped opposing lateral surfaces of the light-transmissive members.

9. The method for manufacturing a light-emitting device according to claim 8, wherein the second portion is disposed on a light-emitting element side of the first portion.

10. A method for manufacturing a light-transmissive member, the method comprising:

providing a moveable stage, a supporting member disposed on the stage, and a light-transmissive sheet disposed on the supporting member, the light-transmissive sheet comprising:
  a first layer having a first surface roughness; and
  a second layer having a second surface roughness larger than the first surface roughness;
moving the stage along a path while rotating a rotary blade, such that the rotary blade cuts the light-transmissive sheet and thereby forms a crevice that separates the light-transmissive sheet into a plurality of light-transmissive members without separating the supporting member, such that the plurality of light-transmissive members are disposed on the supporting member, and such that each light-transmissive member comprises:
  a first portion formed by separation of the first layer, the first portion having the first surface roughness, and
  a second portion formed by separation of the second layer, the second portion having the second surface roughness larger than the first surface roughness,
  wherein one of the first portion and the second portion is layered on the other of the first portion and the second portion; and
subsequently, moving the stage along the same path where the crevice is located while rotating the same rotary blade that was used to cut the light-transmissive sheet, such that the rotary blade blows off cutting chips remaining in or near the crevice without separating the supporting member.

11. The method for manufacturing a light-transmissive member according to claim 10, wherein the supporting member is in contact with the first layer.

12. The method for manufacturing a light-transmissive member according to claim 10,
  wherein the rotary blade rotates in a direction from the supporting member toward the light-transmissive sheet in the dividing of the light-transmissive sheet.

13. The method for manufacturing a light-transmissive member according to claim 10, further comprising suctioning cutting chips produced while cutting the light-transmissive sheet.

14. The method for manufacturing a light-transmissive member according to claim 10, wherein the second layer contains a phosphor, and the phosphor comprises a manganese-activated fluoride phosphor.

15. The method for manufacturing a light-transmissive member according to claim 10, wherein the second layer comprises a plurality of layers, each containing a different phosphor.

16. The method for manufacturing a light-transmissive member according to claim 10,
  wherein the supporting member comprises a UV-curable adhesive, and
  wherein the light-transmissive sheet is disposed on the adhesive.

17. A method for manufacturing a light-emitting device, the method comprising:
  mounting the light-transmissive member manufactured by the method for manufacturing a light-transmissive member according to claim 10 on a light-emitting element.

18. The method for manufacturing a light-emitting device according to claim 17, wherein the second portion is disposed on a light-emitting element side of the first portion.

19. The method for manufacturing a light-transmissive member according to claim 1, wherein, in said moving the rotary blade along the light-transmissive sheet so as to cut the light-transmissive sheet, a groove is formed in the supporting member.

20. The method for manufacturing a light-transmissive member according to claim 10, wherein, in said moving the rotary blade along the light-transmissive sheet so as to cut the light-transmissive sheet, a groove is formed in the supporting member.

* * * * *